United States Patent [19]

Ohkubo et al.

[11] 4,046,595

[45] Sept. 6, 1977

[54] METHOD FOR FORMING SEMICONDUCTOR DEVICES

[75] Inventors: Yoshio Ohkubo, Takatsuki; Yoshichika Kobayashi, Ibaraki, both of Japan

[73] Assignee: Matsushita Electronics Corporation, Japan

[21] Appl. No.: 621,844

[22] Filed: Oct. 14, 1975

[30] Foreign Application Priority Data

Oct. 18, 1974 Japan .................................. 49-120912

[51] Int. Cl.$^2$ ............................................. H01L 21/26
[52] U.S. Cl. .................................... 148/1.5; 148/186; 148/187
[58] Field of Search .......................... 148/1.5, 186, 187

[56] References Cited

U.S. PATENT DOCUMENTS

| | | | |
|---|---|---|---|
| 3,530,343 | 9/1970 | Irie et al. | 148/186 X |
| 3,746,587 | 7/1973 | Rosvold | 148/1.5 X |
| 3,748,187 | 7/1973 | Aubuchon et al. | 148/1.5 |
| 3,755,001 | 8/1973 | Kooi et al. | 148/1.5 |
| 3,808,058 | 4/1974 | Henning | 148/1.5 |
| Re. 28,653 | 12/1975 | Murphy | 148/187 X |

*Primary Examiner*—G. Ozaki
*Attorney, Agent, or Firm*—Burgess, Ryan and Wayne

[57] ABSTRACT

Disclosed is a manufacturing method for semiconductor devices, which comprises the processes of:
 forming at least one recess and at least one projecting portion on a surface of semiconductor substrate; applying coating material on the recess and the projecting portion in such a manner that the layer of the coating material in the recess is thicker than that on the projecting portion; providing a bared portion at the top of the projecting portion by removing the applied coated material on the silicon dioxide layer of the semiconductor substrate at a uniform removing rate; and diffusing impurities to form different conductivity region through the bared top portion.

The highly advantageous results achieved through the use of this newly developed method are (1) the elimination of a process for the self alignment of mask, (2) the production of highly reliable semiconductor devices, and (3) an increase in the productivity of semiconductor devices.

4 Claims, 16 Drawing Figures

METHOD FOR FORMING SEMICONDUCTOR DEVICES

BACKGROUND OF THE INVENTION

This invention relates to a method of forming semiconductor devices. More particularly this invention relates to a semiconductor substrate processing method for selectively forming different conductivity region at predetermined positions.

The integrated-circuit manufacturing technique forming a large number of elements on a single substrate has greatly been advanced. As one of methods for forming increased number of active elements per unit area of a semiconductor substrate, the local oxidation of silicon (LOCOS) method is well known. In this method a silicon nitride layer is formed on a selected portion of the silicon substrate and the remaining area is oxidized. After removing the silicon nitride layer, the position is then diffused with impurities thereby forming one conductivity type of region, which is used as the base. In the conductivity region is formed another type of conductivity region to be used as the emitter. Comparing the method of LOCOS with the prior art of planar semiconductor device forming method, the LOCOS has the advantage of eliminating a process of mask alignment for etching. However, the LOCOS method requires high heat treatment, which lowers the reliability and productivity of semiconductor devices.

SUMMARY OF INVENTION

This invention provides a method of forming semiconductor devices, which method enables us to produce more number of elements per unit area and to introduce a better manufacturing method than those previously known in the art. The gist of this invention is the process of forming desired number of recesses and projecting portions at the desired place on the surface of a semiconductor substrate; oxidizing the surface of the substrate exposed if necessary; applying an organic layer of acid resistant material on the surface of the substrate in such a manner that the thickness of the layer is thicker in the recess than that on the projecting portion; etching the coated layer uniformly at the same rate until the top of the projecting portion is bared, leaving the organic acid resisting material layer in the recess. The bared top of the projecting portion is then ready for the formation of one type of conductivity region.

PRIOR ART

Figure 1:
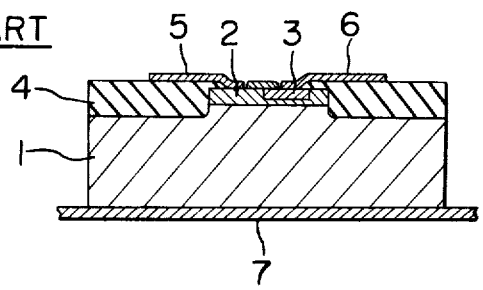
FIG. 1 depicts in cross section a semiconductor device manufactured by the method of local oxidation of silicon LOCOS.

FIG. 1 illustrates the cross section of a semiconductor device fabricated by the LOCOS method. In this method a silicon substrate 1 is selectively covered with silicon nitride $Si_3N_4$ - the heat-resisting layer; the remaining area on the substrate is oxidized and is formed silicon dioxide, $SiO_2$, layer covering the surface, and after removing the silicon nitride layer, the projecting portion is formed having one type of conductivity region. The silicon substrate is the collector region, and the base 2 and the emitter 3 are formed at the top of the projecting portion. The thick silicon dioxide layer 4 of the peripheral area surrounding the projecting area serves as the mask for the formation of one conductivity region 2, and for the passivating layer of the junction and the insulating layer for the base electrode 5 and emitter electrode 6. The metallic bottom plate 7 serves as the collector electrode and heat sink.

DESCRIPTION OF THE PREFERRED EMBODIMENTS

An appreciation of this invention and its distinct advantages can be readily gained by the description of the embodiment of this invention.

Figure 2:
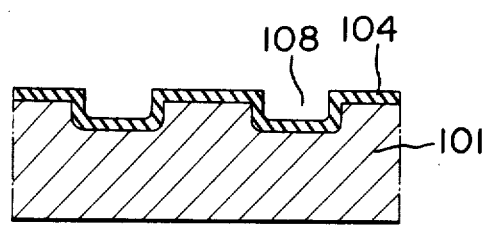
FIGS. 2 to 6 depict the manufacturing processes of a semiconductor device according to the invented method.
Figure 3:
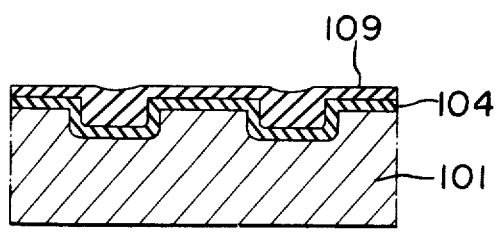

FIGS. 2 to 6 show the processes according to the embodiment of this invention. As shown in FIG. 2, $SiO_2$ layer 104 is formed on the surface of a silicon semiconductor substrate 101 after having formed recess 108, about $3\mu$ deep. The silicon dioxide layer 104, about $0.9\mu$ thick, is formed in an atmosphere of dry oxygen at about 1100° C. for 30 minutes and then in an atmosphere containing steam at the same temperature for about 100 minutes. After the formation of the silicon dioxide layer, as shown in FIG. 3, a layer 109 of etchable coating material is formed. These materials are for example acid resistant material of rubber derivatives, derivatives of cellulose such as acetylcellulose, high molecular weight hydrocarbons such as paraffins, thermosetting resins such as urea-formaldehyde resin, vinyl chloride, acrylic acid ester, polystyrene, and a few water soluble acid resistant materials such as polyvinyl alcohol hardened by cross-linking after coating, and the like.

Figure 4:
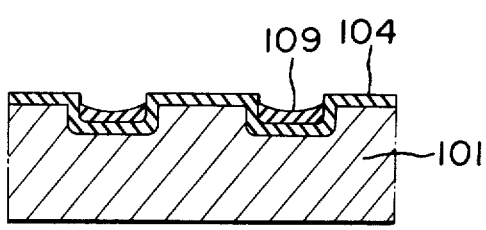
Figure 5:
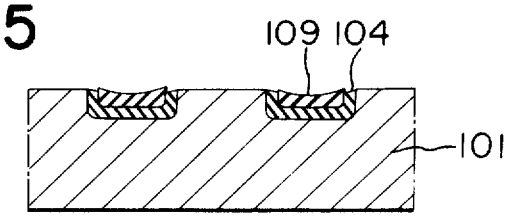

The etchable acid resisting material is applied on the silicon dioxide layer 104. The rubber type photo resist is most suitable for coating over the silicon dioxide layer. When this photo resist is applied under condition, at which a flat surface can be coated with the thickness of $1\mu$, then the recess can be coated about $1.2\mu$ deep and the projecting portion about $0.4\mu$ thick. When the above photo resist is used for the layer 109 and the coated substrate is baked for densifying at the temperature of about 180° to 210° C. and uniformely etched at the same rate by known manner, such as placing in low pressure-oxygen glow-discharge environment, the coating at the top of the projecting portion can be removed first and uncovered, as shown in FIG. 4. In the recesses, however, there is still left the layer of the acid resisting material in some thickness. The substrate can be etched by commonly known $SiO_2$ etchant containing hydrogen fluoride, and then the silicon dioxide layer is removed as shown in FIG. 5.

Figure 6:
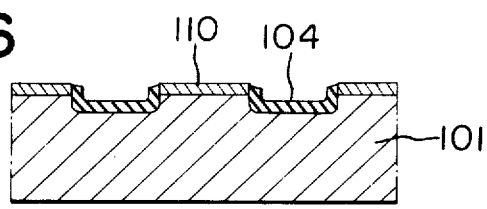

The junction 110 can be formed by diffusing impurities into the uncovered projecting portion, as shown in FIG. 6. According to the embodiment of this invention, as shown in the FIGS. 2 to 6, the process of mask alignment for the selective formation of junction at the top of the projecting portion can be eliminated and one conductivity region can be formed by self-registration.

EXAMPLE 1

Figure 7:
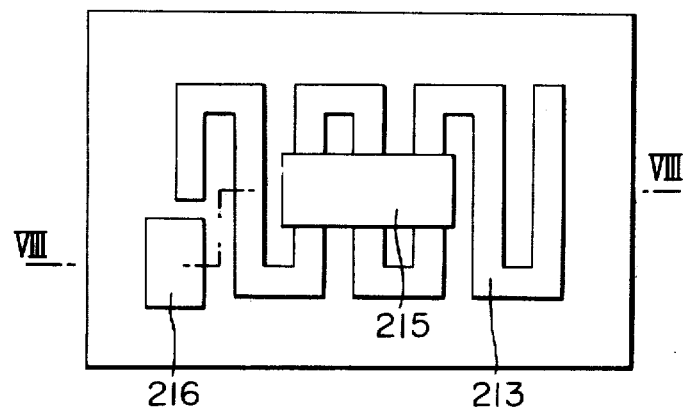
FIGS. 7 and 8 depict the plan view and cross sectional view of a junction type field effect transistor, respectively.
Figure 8:
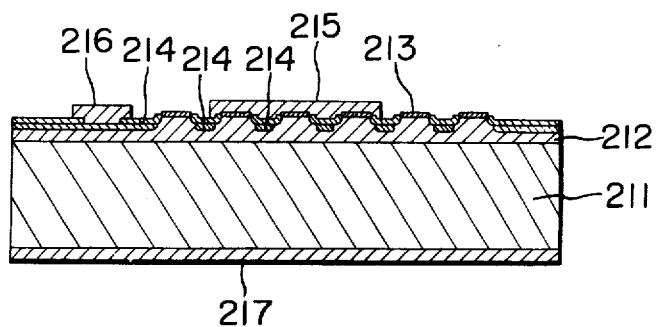
Figure 9:
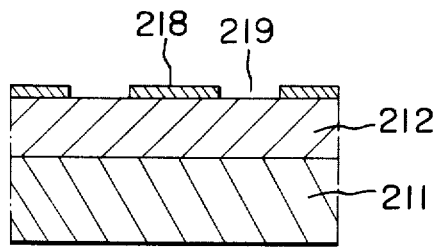
FIGS. 9 to 12 depict a part of the manufacturing process of a field effect transistor.

As an embodiment of this invention, the processes of forming field effect transistors will be described below:

FIGS. 7 and 8 are a plan view and a cross sectional view (VIII—VIII, FIG. 7) of a junction type field effect transistor device respectively. The device comprises P+ type silicon substrate 211 and an epitaxially grown P type region 212 having recesses and projecting portions on its surface. On the projecting portion is formed source region 213 and in the recess is formed gate region 214. The device is provided with the source electrode 215, the gate electrode 216, and the drain electrode 217.

Figure 10:
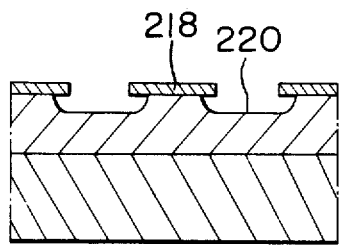
Figure 11:
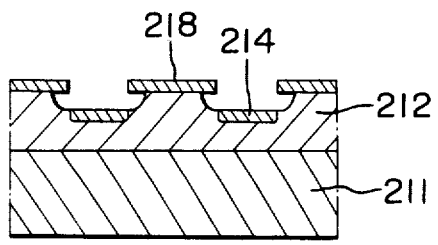

FIGS. 9 to 12 depict a partial process of forming a field effect transistor. On the surface of P+ type silicon substrate 211 is epitaxially grown P type region 212 about 30μ thick, having resistivity of 30 to 50 ohm-cm. On the surface of the P type region is formed silicon dioxide mask 218. The selected portion of which is removed and an opening 219 is formed. Through the opening 219, the surface of the P type region is etched, as shown in the FIG. 10, and recess 220 is formed of about 3μ deep. The silicon dioxide is under etched so that the edge of the layer extends on the recess in the shape of eaves as shown in FIG. 10. Using the layer as a mask ions are implanted in the P type layer 212, thus forming the N type junction region 214 at the bottom of the recess as shown in the FIG. 11. The successful ion implantation can be obtained under the following conditions.

Voltage applied = 75 Kv
Ion density = $5 \times 10^{12}$ cm$^{-2}$

Figure 12:
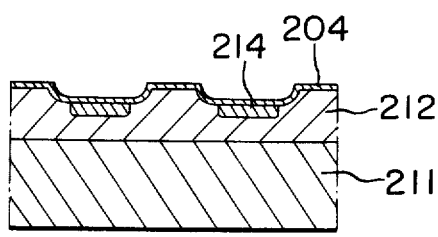

After removing the silicon dioxide layer 218 by hydrofluoric acid etching, a thick silicon dioxide layer 204 is formed by thermal oxidation, as shown in the FIG. 12.

The product shown in the FIG. 12 can be developed to the one shown in the FIGS. 7 and 8 by the method depicted in the FIGS. 2 through 6.

The features of the field effect transistor in this embodiment are as follows:

Pitch = 20 μ
Gate width = 3 μ
Total length of source region = 300 μ
Forward resistance = 8 ohms
Mutual conductance = 200 micromhas
Maximum drain loss = 25 W

EXAMPLE 2

Figure 13A:
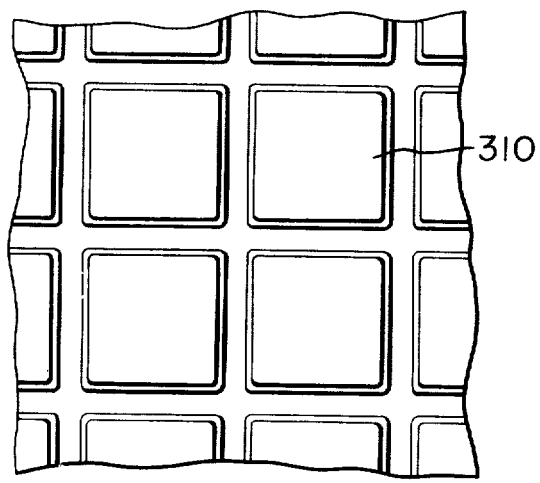
FIGS. 13A and 13B depict a plan view and a cross section view, respectively, of a silicon photo diode array target.
Figure 13B:
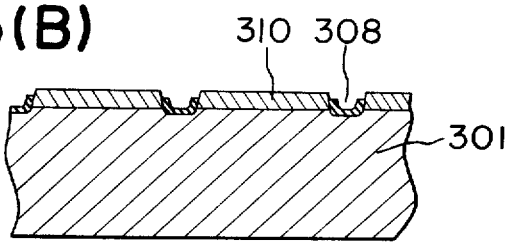

Now the application of this invention to make a silicon photo diode array target of a pick up tube for a TV camera will be discussed. Referring to the drawing of FIG. 6, (301 in FIG. 13B) is an N type silicon monocrystal substrate having the resistivity of 10 to 20 ohm-cm, upon which are formed recesses 108 (308 in FIG. 13B) by the method indicated in the FIGS. 2 through 6, in the array arrangement shown in FIGS. 13A and 13B — plan and cross sectional views respectively — at the pitch distance of 14μ. It is so formed that the width of recess, in which silicon dioxide insulation is formed, is 3μ and at the top of the projecting portion is formed a P+ active region of 1.5 to 2.0μ in depth by diffusing boron impurities as shown in FIG. 6.

Figure 14:
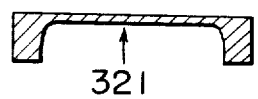
FIG. 14 depicts a cross section of the target after one of the surfaces of substrate etched deep.
Figure 15:
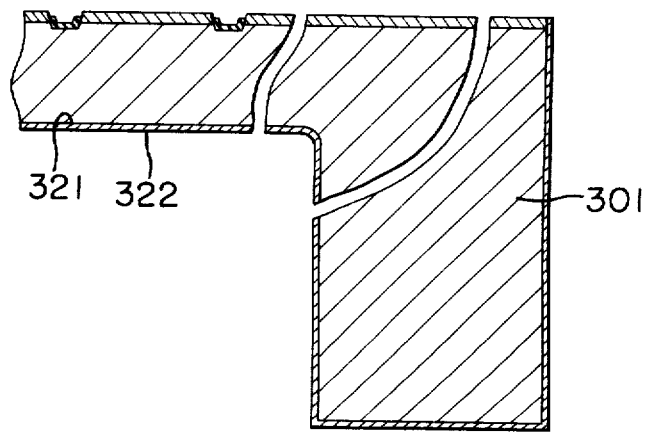
FIG. 15 depicts the cross section of a silicon photo diode array target, wherein the numeral 322 shows the N+ conductivity region.

The processes after the above, are the same as those well known for the manufacturing of the silicon photo diode array — that is: cutting a silicon wafer into the size required for the use as a target of a pick up tube for a TV cammera; leaving its peripheral edge about 1.0 to 2.0 mm for the reinforcement of physical or mechanical strength to achieve the better characteristic of the target; and etching large portion 321 of the substrate inwardly from the side opposite to the array of diodes is provided, by etchant having hydrofluoric acid, nitric acid or acetic acid as the chief ingredient, until the remaining thickness is 13 to 15μ. Then the target becomes as shown in FIG. 14. After diffusing phosphorous from the surface 322 and forming an N+ region and heat treating in hydrogen atmosphere at the temperature of 500° C for 30 minutes, which is required for the improvement of dark current characteristic, the fixation of surface characteristic of the device is completed.

In the pick up tube for a TV camera having the above described mesa type silicon-photo-diode-array target, the P+ region 310 is at the top of projecting portions of silicon substrate, which side is scanned by electron beam. The landing characteristic of the type of the tube is extremely improved, and the electric leakage in the direction along the target surface is extremely low, because adjacent P+ regions are insulated by silicon dioxide layer 4. For a 1 inch type target of a pick up tube for a TV camera with target voltage of 10 volts and mesh electrode voltage of 300 volts, it was found that the image lag was 10 percent and the horizontal resolution was 600 TV. lines. These results achieved by the invention are much better than those of the conventional target having the same geometrical formation of the P+ region prepared by the same diffusion method and having the same element dimensions of planar silicon diode array type, whose image lag was found to be 16 percent and whose horizontal resolution, 520 TV lines.

In the above embodiment at the top of projecting portion, which has one type of conductivity, is formed another type of conductivity region and P-N-junction therebetween. This method of forming one type of conductivity region at the top of projecting portion is applicable to a Schottky type barrier layer, a hetro junction region, and the like where the region is formed at the top of the mesa type projection.

According to this invention, at least one recess is formed at selected portions, bottom of the recess is coated with a layer of coating material, such as acid resisting organic material, for the purpose of working the projecting portion. By so doing there is a merit of eliminating a process of mask alignment. When ions are implanted into the top of the projecting portion, the material in the recess acts as the mask. This will also simplify the working procedures. This invention is applicable in a wide area of semiconductor manufacturing.

What is claimed is:

1. The method of forming semiconductor devices comprising:
    forming at least one recess on a surface of a semiconductor substrate;
    applying an etchable coating material on said surface of the substrate in such manner that the layer in the recess is thicker than that on the projecting portion;
    etching the layer of said coating material uniformly at the same rate until such time as the projecting portion is bared, whereas the recess is still covered with the coating material and stopping the etching of said coating material after said time and before the coating material in the recess has been removed; forming one conductivity region in the projecting portion of said semiconductor substrate.

2. The method of forming semiconductor devices claimed in the claim 1 characterized in that said layer of said coating material is etched uniformly at the same rate in a low pressure oxygen glow-discharge environment.

3. The method of forming semiconductor devices claimed in the claim 1, characterized in that said active region is formed by an ion implantation method.

4. The method of forming semiconductor devices claimed in the claim 1, characterized in that said coating material is an acid resisting material.

* * * * *